(12) United States Patent
D'Agostino et al.

(10) Patent No.: US 6,649,222 B1
(45) Date of Patent: Nov. 18, 2003

(54) MODULATED PLASMA GLOW DISCHARGE TREATMENTS FOR MAKING SUPERHYDROPHOBIC SUBSTRATES

(75) Inventors: Riccardo D'Agostino, Bari (IT); Italo Corzani, Chieti (IT); Pietro Favia, Bari (IT); Ritalba Lamendola, Bari (IT); Gianfranco Palumbo, Bad Homburg (DE)

(73) Assignee: The Procter & Gamble Company, Cincinnati, OH (US)

( * ) Notice: Subject to any disclaimer, the term of this patent is extended or adjusted under 35 U.S.C. 154(b) by 0 days.

(21) Appl. No.: 09/786,085

(22) PCT Filed: Sep. 7, 1999

(86) PCT No.: PCT/US99/20504

§ 371 (c)(1),
(2), (4) Date: Feb. 28, 2001

(87) PCT Pub. No.: WO00/14297

PCT Pub. Date: Mar. 16, 2000

(30) Foreign Application Priority Data

Sep. 7, 1998 (EP) .............................................. 98116895

(51) Int. Cl.$^7$ .................................................. C08J 7/18
(52) U.S. Cl. .................. 427/490; 427/212; 427/213.31; 427/216; 427/221; 427/222; 427/243; 427/247; 427/255.14; 427/225.21; 427/255.3; 427/294; 427/295; 427/296; 427/491; 427/492; 427/561; 427/562; 427/570
(58) Field of Search .................. 427/490, 491, 427/492, 561, 562, 570, 212, 213.31, 216, 221, 222, 243, 247, 255.14, 255.21, 255.3, 294, 295, 296

(56) References Cited

U.S. PATENT DOCUMENTS

| 4,632,842 A | 12/1986 | Karwoski et al. |
| 5,888,591 A | * 3/1999 | Gleason et al. ............. 427/522 |
| 6,117,155 A | * 9/2000 | Lee ............................. 606/189 |

FOREIGN PATENT DOCUMENTS

| EP | 0 531 029 A | 3/1993 |
| JP | 03 006204 A | 1/1991 |
| WO | WO 97/42356 | * 11/1997 ........... C23C/16/00 |

* cited by examiner

*Primary Examiner*—Bernard Pianalto
(74) *Attorney, Agent, or Firm*—Larry L. Huston; Leonard W. Lewis; Steven W. Miller

(57) ABSTRACT

A method for treating substrates including the steps of:
  providing a substrate;
  exposing said substrate to a plasma glow discharge in the presence of a fluorocarbon gas;
  maintaining said gas at a pressure between about 50 mTorr and about 400 mTorr;
  generating said plasma as a modulated glow discharge;
  pulsing said discharge at an on time of 1–500 milliseconds;
  pulsing said glow at an off time of 1–1000 milliseconds;
  maintaining said plasma glow discharge at a power density of 0.02–10 watts/cm$^2$; and
  applying a hydrophobic coating to said substrate.

17 Claims, 6 Drawing Sheets

ON  OFF

MODULATED PLASMA GLOW DISCHARGE TREATMENTS FOR MAKING SUPERHYDROPHOBIC SUBSTRATES

FIELD OF THE INVENTION

The present invention relates to a method for rendering substrates super hydrophobic.

BACKGROUND OF THE INVENTION

Plasma-deposited fluorocarbon coatings are often cited in the literature as "teflon-like coatings" because their CFx ($0<x\leq 2$) composition and surface energy can be made very close to that of polytetrafluoroethylene (PTFE,—($CF_2$—$CF_2$—)$_n$), known on the market as Teflon®.

Plasma coating processes of metals, polymers, and other substrates, with fluorocarbon films are known in the art. As an example, it is known from U.S. Pat. No. 4,869,922 and from other sources, that deposition from continuous (i.e. non modulated) radiofrequency (RF) glow discharges fed with fluorocarbons provides films, layers, tapes, plates, and differently shaped articles made of plastics, metals or other materials, with a thin fluorocarbon coating, with no other material interposed between the coating itself and the substrate. Such coatings are claimed to have very good adherence to the items processed, to be void-free, to be not porous, and to show controlled wettability characteristics, which depend on their the above mentioned patent leads to coatings characterized by static water contact angle (WCA) values lower than 120°.

Glow discharges treatments are also considered in U.S. Pat. No. 5,462,781 for improving the bondability of an implantable polymer medical device or for changing the wettability of a polymer fabric. Several of the references discussed in this patent confirm non modulated, continuous plasma treatments as a means for varying the inherent WCA of a surface. U.S. Pat. No. 5,034,265 discloses a non modulated, continuous plasma treatment for improving the biocompatibility of vascular grafts with a $CF_x$ fluorocarbon coating deposited at the inside wall of the grafts in a proper plasma reactor fed with tetrafluoroethylene ($C_2F_4$, TFE) at 0.2 Torr. In the preferred embodiment of the invention no other materials are interposed between the substrate and the coating.

SUMMARY OF THE INVENTION

Specifically, the present invention, having the features mentioned in the annexed claims, relates to a modulated plasma deposition process for coating substrates with a thin, well adherent, nonporous, fluorocarbon coating with super hydrophobic properties, i.e. characterized by static water contact angle (WCA) values, measured on a smooth and plane surface, higher than about 120°, preferably higher than 130°, more preferably higher than 150°. Substrates treated with this method have their hydrophobicity markedly improved, e.g. can be made effectively waterproof while maintaining their previous characteristics such as permeability to gases and vapors.

The increased hydrophobicity results also in additional benefits such as prevention of build-up of soiling (e.g. on hard surfaces such as glass, ceramics, metals and other surfaces exposed to dirt), prevention of lumping of powders or granules, aiding in complete emptying of containers which contain hydrophilic materials such as liquid detergent or shampoo bottles or beverage containers or liquid tanks or flowable particle tanks e.g. flour tanks, prevention of contamination and build-up on toothbrushes and bristles. Also by using a metal electrode, made of an antibacterial metal such as silver or gold, in the method according to the present invention an antibacterial property can be provided to the coated surfaces.

The present invention deals with a method of treating polymeric or non polymeric articles for making their surface super hydrophobic, i.e. characterized by static water contact angle (WCA) values higher than about 120°, preferably higher than 130°, more preferably higher than 150°. The method consists of a modulated glow discharge plasma treatment performed with a fluorocarbon gas or vapor compound fed in a properly configured reactor vessel where the substrates are positioned. The plasma process deposits a continuous, fluorocarbon thin film so with super hydrophobic surface characteristics, tightly bound to the substrate.

The substrates of interest for the present invention may include a wide range of materials in form of webs, tapes, films, powders, granules, particles, woven and non-woven layers; substrates can be porous or non-porous, molded or shaped, rigid or flexible, made of polymers, textiles, papers, cellulose derivatives, biodegradable materials, metals, ceramics, semiconductors, and other inorganic or organic materials. Preferably, the substrate is formed into a desired shape or configuration, depending on its intended use, before being subjected to the treatment object of this invention.

When organic synthetic resins are chosen, such substrate materials could be fabricated from polyethylene, polyacrylics, polypropylene, polyvinyl chloride, polyamides, polystyrene, polyurethanes, polyfluorocarbons, polyesters, silicone rubber, hydrocarbon rubbers, polycarbonates and other synthetic polymers.

"Plasma," as used herein, is used in the sense of "low-temperature plasma" or "cold plasma" produced by igniting a glow discharge in a low pressure gas through a power supply. Glow discharges contain a variety of species chemically active and energetic enough to cause chemical reactions with surfaces exposed, i.e. covalent bonding to a suitable substrate material. Cold plasmas, or glow discharges, are generally produced with high frequency (from KHz to MHz and GHz) power supply (HF plasmas). Electrons, positive and negative ions, atoms, excited. molecules, free radicals, and photons of various energies are formed in a cold plasma.

"Modulated plasma" means a non continues plasma, HF plasma, i.e. a glow discharge whose driving power is pulsed between a maximum value and zero (ON/OFF pulse) or a fraction of it, at a certain frequency, with a proper pulse generator connected to the main power supply. In the case of ON/OFF pulsed systems, the time ON and time OFF values are among the experimental parameters of the process. Superimposing a triggering ON/OFF pulse to the main high frequency field which generally drives a glow discharge, alternates short continuous discharges with plasma OFF time intervals where active species still exists in the gas phase, but the effects of ions and electrons are strongly reduced. This alternating exposure to two different processes leads to unique surface modifications of substrates, which are very different from those of continuous plasma process, as it will be shown.

"Plasma deposition" or "plasma polymerization" is the plasma process that leads to the formation of thin (0.01–2 $\mu$m), partly crosslinked, void-free, continuous coatings well adherent to substrates. The molecules of the gas phase are fragmented by energetic electrons, which are able to break chemical bonds; this process leads to radicals and other chemical species which are able to deposit at surfaces inside the vacuum chamber and form a thin, uniform film. The action of the plasma may also affect the surface of a polymer substrate in the early deposition time; energetic species may break bonds in the substrate with possible evolution of gas products, such as hydrogen, and formation of free radical sites which contribute to form covalent bonds between the growing film and the substrate.

It has been found that it is possible to deposit thin fluorocarbon films with super hydrophobic characteristics, i.e. showing a surprisingly high WCA value, even up to about 165°. The present invention thus provides a modulated plasma process for coating substrates of the type mentioned above, with fluorocarbon films characterized by a WCA value higher than 120°, preferably higher than 130°, more preferably higher than 150°, by using a modulated plasma process, as it will be described.

According to the present invention, fluorocarbon coatings with F/C ratio from about 1.50 to about 2.00 have been deposited, characterized by WCA values higher than about 120°, such as between about 155° and about 165°. The coatings have been deposited at the surface of different polymer and non polymer substrates such as polyethylene (PE), polypropylene (PP) polyethyleneterephtalate (PET), and paper in form of films and fabrics, glass and silicon, among many. It should be noted that the F/C ratio could be theoretically up to 3, if the coating would be formed only by a mono-molecular layer of $CF_3$ groups. But the formation of intermolecular cross-links and the formation of claims (containing $CF_2$ fragments) which are grafted onto the surface lowers the above theoretical value so that the obtained coatings, notwithstanding the fact that they contain many $CF_3$ groups, have a global F/C ratio in the range of about 1.50 to about 2.00.

The thickness of the coatings depends on the duration of the plasma process at different conditions, and can be kept between 0.01 and 2 $\mu$m. It has been found that the nature of the substrate materials does not influence neither the chemical composition nor the thickness of the coatings. Coatings with WCA values up to about 165° (e.g. 165°±5°) were obtained.

Substrate to be treated are subjected to modulated plasma gas discharge in the presence of at least one fluorocarbon gas or vapor. Specifically, fluorocarbon gases or vapors such as tetrafluoroethylene (TFE,$C_2F_4$), hexafluoropropene (HFP, $C_3F_6$), perfluoro-(2-trifluoromethyl-)pentene, perfluoro-(2-methylpent-2-ene) or its trimer may be used, TFE being the presently preferred choice. The plasma deposition process is preferably performed by positioning the substrate in a properly arranged plasma reactor, connecting the reactor to a source of a fluorocarbon gas or vapor, regulating flow and pressure of the gas inside the reactor, and sustaining a glow discharge in the reactor with a high frequency electric field in a pulsed (modulated), node by means of a suitable pulsed power supply. The parameters which define the glow discharge treatment includes the feed gas or vapor, its flow rate, its pressure, the position of the substrate inside the reactor, the design of the reactor, the exciting frequency of the power supply, the input power, the time ON and the time OFF of the pulsing system. Substrates, as those listed in the abstract, may be positioned in the "glow" region of the discharge, i.e. directly exposed to the plasma, or in the "afterglow" region, i.e. downstream respect to the visible glow. The two positions generally result in coatings with different composition and properties; treating the substrates with modulated glow discharge results also in different coatings respect to continuous treatments.

BRIEF DESCRIPTION OF THE DRAWINGS

In the following detailed description the invention will be described, purely by way of example, with reference to the enclosed figures of drawing, wherein.

DETAILED DESCRIPTION OF THE INVENTION

Figure 1A:
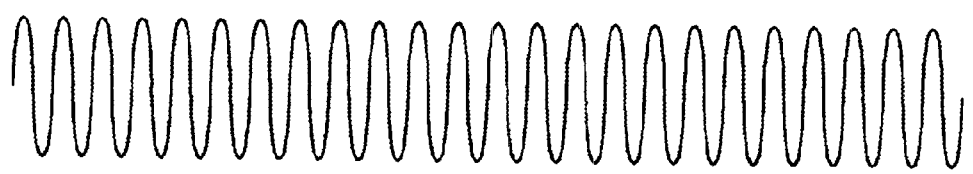
FIG. 1 compares a conventional "continuous" RF glow discharge with an ON/OFF "modulated" RF glow discharge.
Figure 1B:
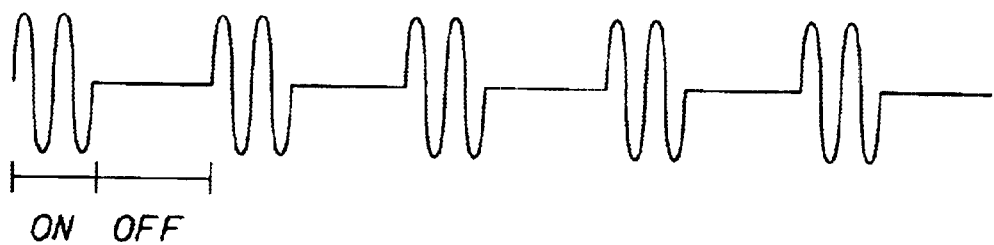

FIG. 1 compares a conventional "continuous" plasma (FIG. 1a) with the modulated process of the invention, (FIG. 1b) showing pulsed alternating plasma ON with plasma OFF (i.e. no plasma) times. The two processes are schematized by referring to their driving signals.

Figure 2:
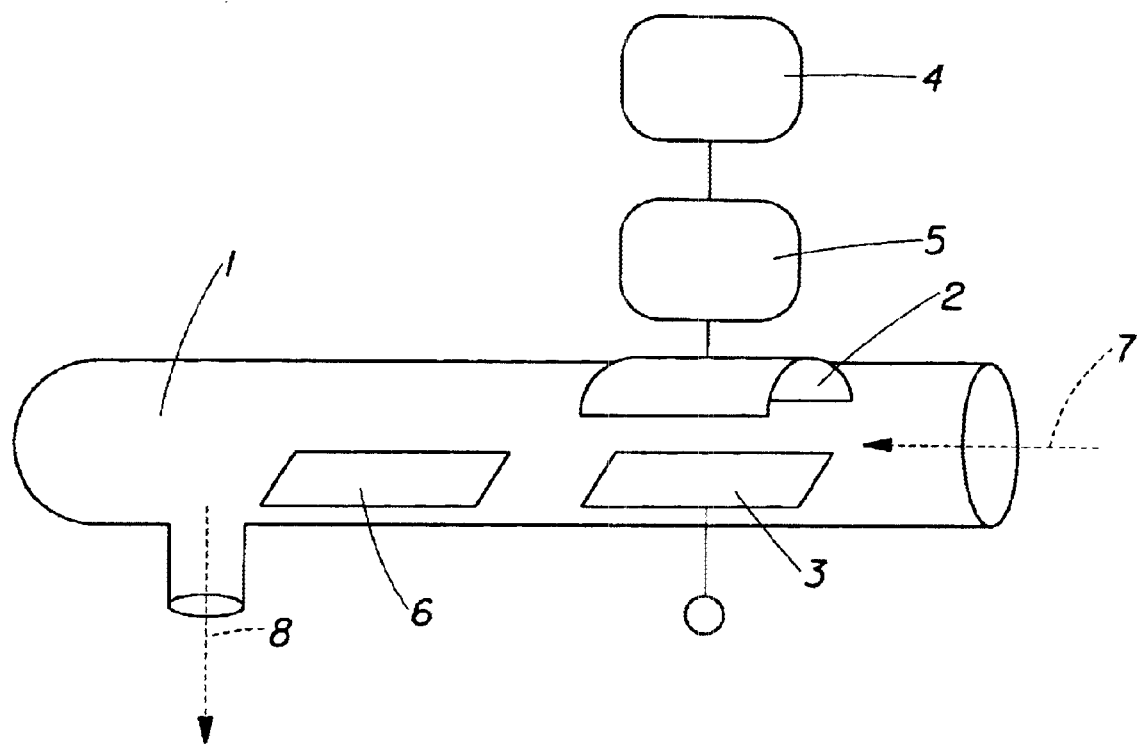
FIG. 2 portrays a typical scheme of a plasma reactor adapted for use within the context of the invention.

The reactor 1 schematically shown in FIG. 2 was utilized not exclusively for developing the deposition method object of the present invention. The reactor vacuum chamber 1 is made of Pyrex glass, is provided with an external RF powered electrode 2 and an internal grounded electrode 3. The external electrode is connected to a power supply 4 (typically a radiofrequency generator operating at e.g. 13.56 MHz) through a matching network and an ON/OFF pulse generator 5. The substrates can be treated in the "glow" region of the reactor, onto the grounded electrode 3, as well as in its "afterglow" position i.e. at an afterglow substrate holder 6. The gas/vapor is fed through a proper mass flowmeter through a gas/vapor feeding manifold 7, and its pressure, measured at the pump out exit 8 of the reactor, kept at a certain constant value with a manual valve on the vacuum connection between the reactor and its pumping unit. Even though the arrangement shown in the drawing represents a presently preferred choice, those skilled in the art will immediately recognize that pulsed energization of the plasma reactor can be achieved by different means such as direct energization by means of pulsed RF generators commonly used in radar and telecommunication techniques.

Preferably, the deposition process is performed with an RF (13.56 MHz) generator. The RF power delivered to the external electrode of the reactor is kept in the 1–500 Watts range for a power density of 0.02–10 Watt/cm$^2$. The reactor is fed with a fluorocarbon compound at a 1–100 sccm flow rate and is kept at a constant pressure of 50–1000 mTorr during the process. Preferably, the glow discharges are modulated through the pulse generator, preferably at 1–500 ms time ON and 1–1000 ms time OFF values, with respective values of about 10 ms and about 190 ms being the most preferred choice at present. The deposition process may range from a few seconds to many hours; during this time a uniform fluorocarbon coating is deposited on the substrates positioned in the glow as well as on those in the afterglow region. The deposition rate, a typical one being in the 20–400 Å/min range, was measured by weighing (weight/time) the substrates before and after the discharge, or by measuring the thickness of the coatings (thickness/time) with an Alpha Step profilometer. The deposition rate and the chemical composition of the coating depend on the experimental conditions (pressure, power, substrate position time ON, time OFF, gas feed and flow rate) of the discharge.

The coatings obtained are uniform over the entire surface of the substrate; when deposited on flat (i.e. plane), smooth substrates, their hydrophobic character has been estimated through their static WCA value, as measured with a WCA goniometer. The measurement is done on a flat, i.e. plane, and smooth surface of a substrate after coating. The term smooth as used herein for water contact angle measurements refers to a roughness of no more than 5 microns in accordance with standard roughness measurements on continuous surfaces. WCA values in the range about 120° to about 165°, corresponding to a critical surface tension lower than that of PTFE (18 dynes/cm) have been measured for fluorocarbon CFx coatings, when x ranges between about 1.50 and about 2.00. The chemical composition of coatings is preferably determined by Electron Spectroscopy for Chemical Analysis (ESCA) within the sampling depth of the technique (about 100 Å). The adherence of the coating to the substrate is very good.

The following examples are given for the purpose of still better illustrating the inventive concept of the present invention, and for highlighting the advantages of using modulated over continuous treatments.

EXAMPLE 1

Three sets of substrates of silicon, PE and PP, of areas in the range of 2–10 cm² per substrate, were positioned onto the grounded electrode 3 of the reactor schematized in FIG. 2. A similar set of substrates was positioned in the afterglow position at 6. $C_2F_4$ was set to feed continuously the reactor at 6 sccm, and the pressure set at 300 mTorr. The RF generator was connected to the reactor and allowed to sustain the discharge with 50 Watt of input power for 90 min, then switched off.

Another glow discharge was subsequently run with a similar set of substrates positioned in the glow, position and no substrates in the afterglow position, under the same conditions described above except for the fact that modulation was effected at 10 ms time ON and 190 ms time OFF through the pulse generator.

At the end of the two discharges the substrates were extracted from the reactor and their WCA measured. The WCA values shown in Table 1 were found, which are compared to the WCA values of the unprocessed substrates. A deposition ate of 30±5 Å/min was measured for the coatings deposited in the modulated mode.

Figure 3:
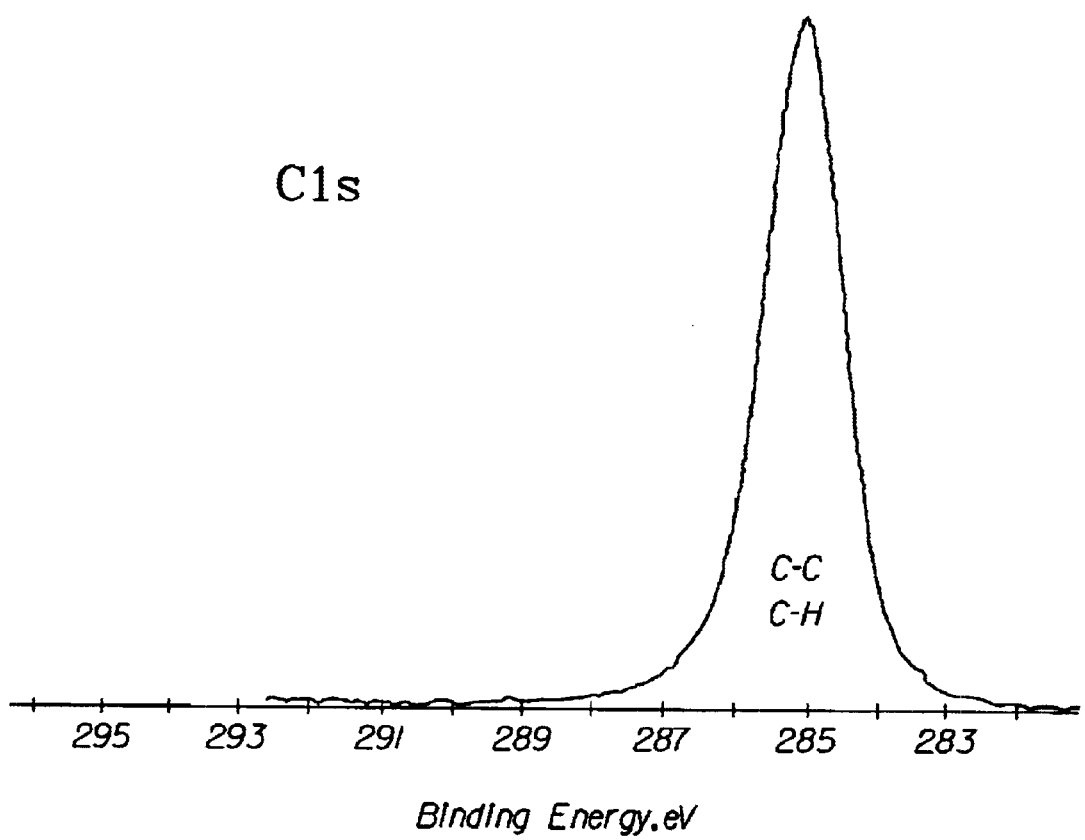
FIG. 3 shows a C1s ESCA signal of an uncoated polyethylene substrate wherein the signal is due only to C—H, C—C bonds of the substrate.
Figure 4:
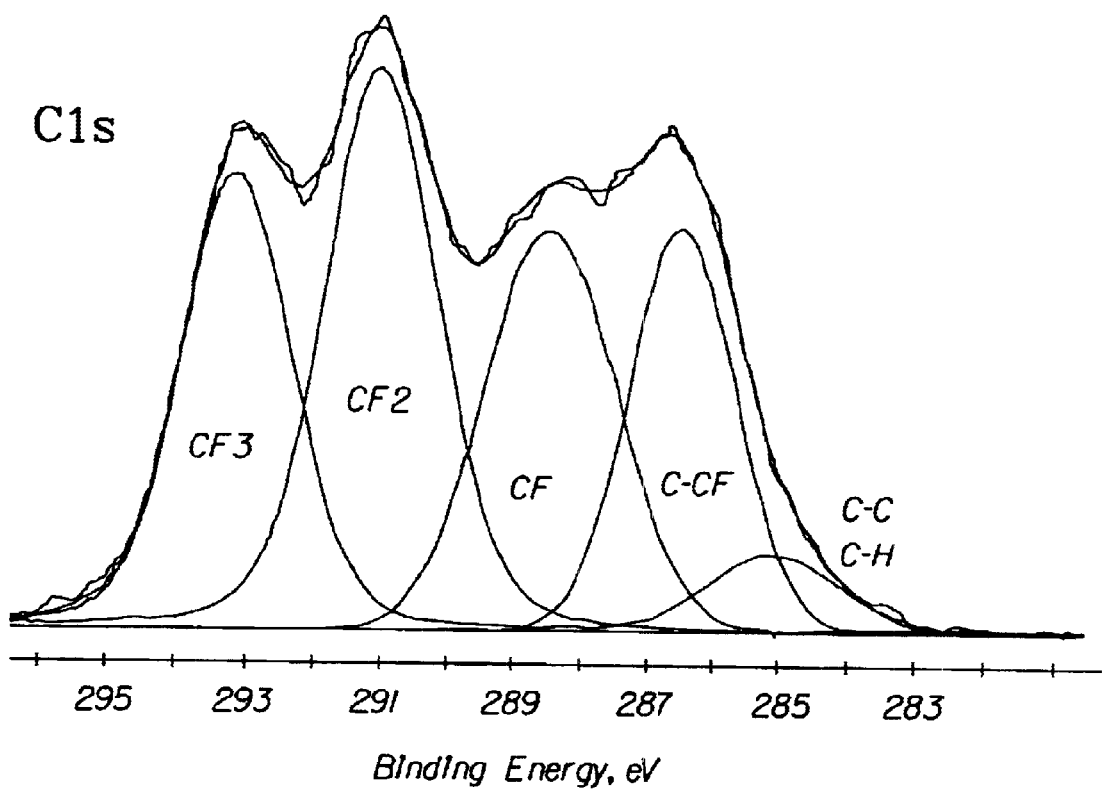
FIG. 4 shows a C1s ESCA signal of a PE substrate coated with a fluorocarbon coating deposited as described in example 1 (glow position, continuous mode), with WCA of 100±5°; the signal is composed by components due to CF3, CF2, CF and CCF bonds of the fluorocarbon coating, and to C—H, C—C bonds due to surface contamination.
Figure 5:
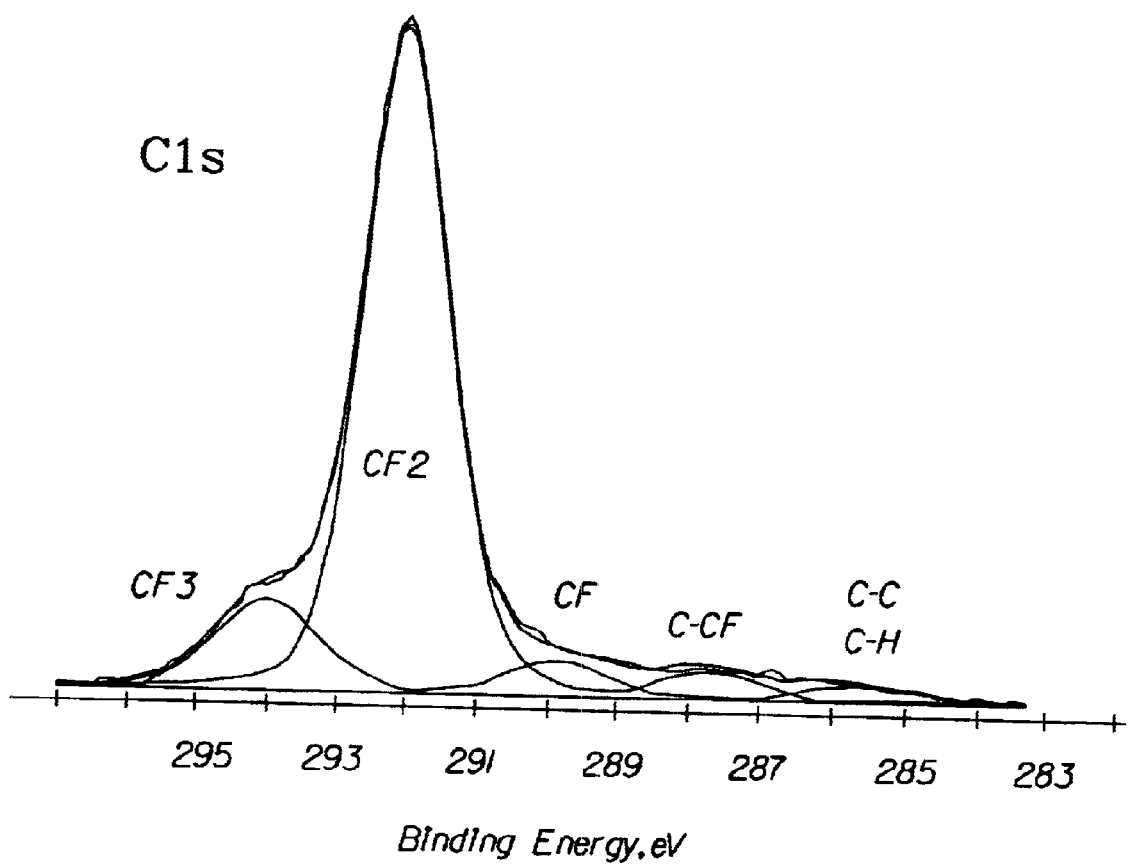
FIG. 5 shows a C1s ESCA signal of a PE substrate coated with a fluorocarbon coating deposited as described in example 1 (afterglow position, continuous mode), with WCA of 120±5°; the signal is composed by components due to CF3, CF2, CF and CCF bonds of the fluorocarbon coating, and to C—H, C—C bonds due to surface contamination.
Figure 6:
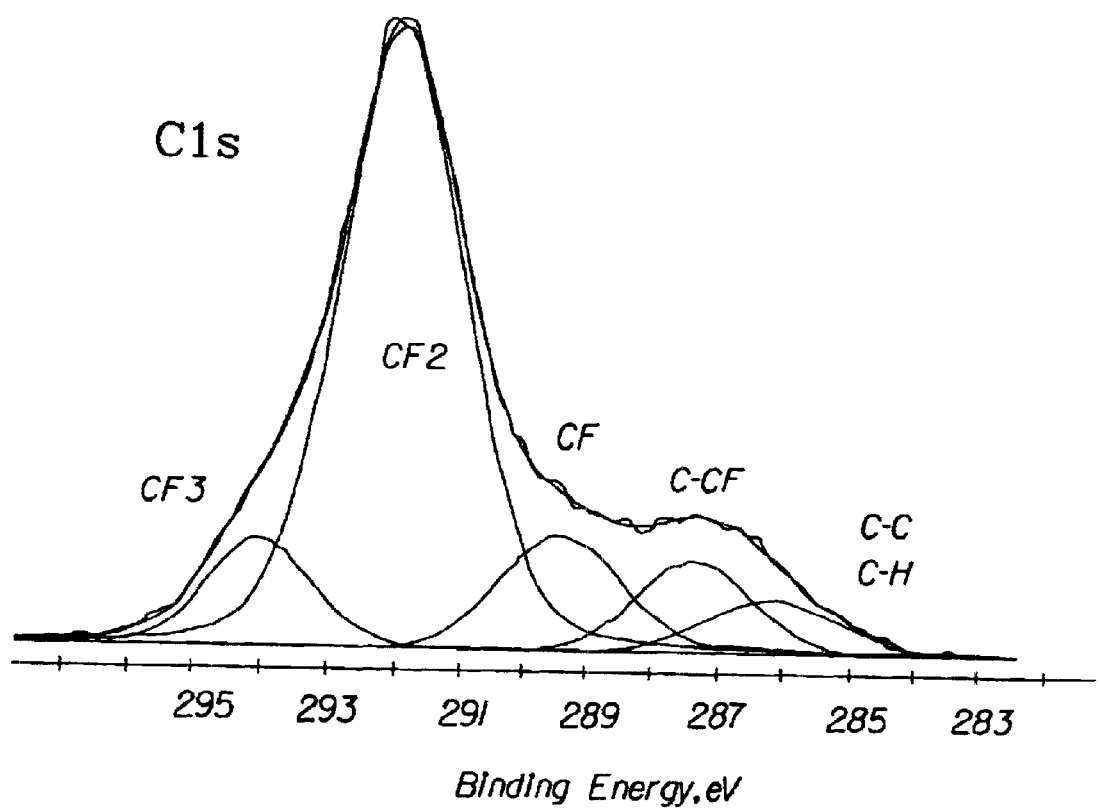
FIG. 6 shows a C1s ESCA signal of a PE substrate coated with a fluorocarbon coating deposited as described in example 1 (glow position, modulated mode), with WCA of 165±5°; the signal is composed by components due to CF3, CF2, CF and CCF bonds of the fluorocarbon coating,; and to C—H, C—C bonds due to surface contamination.

Other substrates, treated in the two modes, were analysed with the ESCA technique. Their surface composition resulted to be entirely composed by carbon and fluoride (fluorine as element), according to the results shown in Tables 2a–c. No other elements were detected (e.g. Si for silicon substrates), which means that the coatings are continuous. The C1s spectrum of the uncoated PE substrate is shown in FIG. 3, while the C1s spectra of PE samples coated as described above are shown in FIGS. 4, 5 and 6, respectively.

TABLE 1

| SUBSTRATE | Si | PE | PP |
|---|---|---|---|
| WCA unprocessed | 15° ± 3° | 95° ± 3° | 85° ± 3° |
| WCA continuous discharge (glow position) | 100° ± 5° | 100° ± 5° | 100° ± 5° |
| WCA continuous discharge (afterglow position) | 120° ± 5° | 120° ± 5° | 120° ± 5° |
| WCA modulated discharge (glow position) | 165° ± 5° | 165° ± 5° | 165° ± 5° |

TABLE 2a

ESCA results for the continuous discharge (glow position) of Example 1

| COATED SUBSTRATE | Si | PE | PP |
|---|---|---|---|
| carbon atomic % | 43.3 | 42.4 | 42.9 |
| fluorine atomic % | 56.7 | 57.6 | 57.1 |
| F/C ratio | 1.31 | 1.36 | 1.33 |

TABLE 2b

ESCA results for the continuous discharge (afterglow position) of Example 1

| COATED SUBSTRATE | Si | PE | PP |
|---|---|---|---|
| carbon atomic % | 34.4 | 33.8 | 34.1 |
| fluorine atomic % | 65.6 | 66.2 | 65.9 |
| F/C ratio | 1.91 | 1.96 | 1.93 |

TABLE 2c

ESCA results for the modulated discharge (glow position) of Example 1

| COATED SUBSTRATE | Si | PE | PP |
|---|---|---|---|
| carbon atomic % | 36.4 | 36.2 | 36.7 |
| fluorine atomic % | 63.6 | 63.8 | 63.3 |
| F/C ratio | 1.75 | 1.76 | 1.72 |

EXAMPLE 2

Three sets of substrates of glass, silicon and PE, of areas in the range of 2–10 cm² per substrate, were positioned onto the grounded electrode 3 of the reactor schematized in FIG. 2. A similar set of substrates was positioned in the afterglow position. $C_3F_6$ was set to feed continuously the reactor at 5 sccm, and the pressure set at 300 mTorr. The RF generator was connected to the reactor and allowed to sustain the discharge with 50 Watt of input power for 60 min, then switched off.

Another glow discharge was subsequently run with a similar set of substrates positioned in the glow position and no substrates in the afterglow, under the same conditions described above except for the fact that modulation was effected at 10 ms time ON and 90 ms time OFF through the pulse generator.

At the end of the two discharges the substrates were extracted from the reactor and their WCA measured. The WCA values shown in Table 3 were found, which are compared to the WCA values of the unprocessed substrates. A deposition rate of 70±5 Å/min was measured for the coatings deposited in the modulated mode.

Other substrates, treated in the two modes, were analysed with the ESCA technique; their surface composition resulted to be entirely composed by carbon and fluoride (fluorine as element), according to the results shown in Tables 4a–c. Also for this case, since no other elements were detected (e.g. Si for silicon and glass substrates), the coatings were assumed to be continuous.

TABLE 3

| SUBSTRATE | glass | Si | PE |
|---|---|---|---|
| WCA unprocessed | 35° ± 3° | 15° ± 3° | 95° ± 3° |
| WCA continuous discharge (glow position) | 105° ± 5° | 105° ± 5° | 105° ± 5° |
| WCA continuous discharge (afterglow position) | 120° ± 5° | 120° ± 5° | 120° ± 5° |
| WCA modulated discharge (glow position) | 120° ≅ 5° | 120° ± 5° | 120° ± 5° |

TABLE 4a

ESCA results for the continuous discharge (glow position) of Example 2

| COATED SUBSTRATE | glass | Si | PE |
|---|---|---|---|
| carbon atomic % | 42.7 | 42.1 | 41.5 |
| fluorine atomic % | 57.3 | 57.9 | 58.5 |
| F/C ratio | 1.34 | 1.37 | 1.41 |

TABLE 4b

ESCA results for the continuous discharge (afterglow position) of Example 2

| COATED SUBSTRATE | glass | Si | PE |
|---|---|---|---|
| carbon atomic % | 37.1 | 38.3 | 38.1 |
| fluorine atomic % | 62.9 | 61.7 | 61.9 |
| F/C ratio | 1.69 | 1.61 | 1.62 |

TABLE 4c

ESCA results for the modulated discharge (glow position) of Example 2

| COATED SUBSTRATE | glass | Si | PE |
|---|---|---|---|
| carbon atomic % | 38.1 | 39.9 | 39.2 |
| fluorine atomic % | 61.9 | 60.1 | 60.8 |
| F/C ratio | 1.62 | 1.51 | 1.55 |

EXAMPLE 3

Three set of substrates of polished silicon, polyethyleneterephtalate (PET), and 3 mm thick FAM (Functional Absorbent Material), an hydrophilic absorbent material made according to the teachings of U.S. Pat. No. 5,260,345, of areas in the range of 2–10 cm$^2$ per substrate, were positioned onto the grounded electrode 3 of the reactor schematized in FIG. 1. $C_2F_4$ was set to feed continuously the reactor at 5 sccm, and the pressure set at 400 mTorr. The RF generator was connected to the reactor and allowed to sustain the discharge for 20 min in the modulated mode (10 ms time ON; 190 Ms time OFF) with 75 Watt of input power. At the end of the discharge the substrates were extracted from the reactor, and their WCA measured. The values shown in Table 5 were found, which are compared to the WCA values of the unprocessed substrates. A deposition rate of 300±10 Å/min was measured.

Other substrates were ESCA analysed; their surface composition resulted to be entirely composed by carbon and fluoride (fluorine as element), according to the results shown in Table 6. No other elements have been detected (e.g. Si for silicon substrates, and O for PET substrates), thus the coatings can be assumed to be continuous.

The coated FAM substrate was cut along its thickness, and the freshly cut surface, which was not directly exposed to the discharge, analysed by WCA and ESCA measurements. The data shown in Table 7 demonstrate that the thick FAM sample was treated not only on the surface exposed to the glow, but also inside its bulk, which demonstrates that the plasma treatment is able to penetrate through porous substrates.

TABLE 5

| SUBSTRATE | PET | Si | FAM |
|---|---|---|---|
| WCA unprocessed | 75° ± 3° | 15° ± 3° | WCA unmeasurable, the drop is adsorbed by the material |
| WCA modulated discharge (glow position) | 155° ± 5° | 155° ± 5° | 155° ± 10° |

TABLE 6

ESCA results for the modulated discharge (glow position) of Example 3

| COATED SUBSTRATE | PET | Si | FAM |
|---|---|---|---|
| carbon atomic % | 34.8 | 35.6 | 34.0 |
| fluorine atomic % | 65.2 | 64.4 | 66.0 |
| F/C ratio | 1.87 | 1.81 | 1.94 |

TABLE 7

ESCA results for the treated FAM sample of Example 3 cut just after the treatment

| SUBSTRATE | bulk FAM, cut after the treatment |
|---|---|
| WCA (modulated discharge) | the drop of water is not absorbed; the material is evidently much more hydrophobic respect to the untreated one; WCA is unmesurable due to surface roughness |
| carbon atomic % | 38.5 |
| fluorine atomic % | 61.5 |
| F/C ratio | 1.60 |

What is claimed is:

1. A method for treating substrates including the steps of:

providing a substrate;

exposing said substrate to a plasma glow discharge in the presence of a fluorocarbon gas;

maintaining said gas at a pressure between about 50 mTorr and about 400 mTorr;

generating said plasma as a modulated glow discharge;

pulsing said discharge at an on time of 1–500 milliseconds;

pulsing said glow at an off time of 1–1000 milliseconds;

maintaining said plasma glow discharge at a power density of 0.02–10 watts/cm$^2$; and applying a hydrophobic coating to said substrate.

2. A method according to claim 1 wherein said water contact angle is at least 120 degrees.

3. A method according to claim 2 wherein said water contact angle is at least 155 degrees.

4. The method of claim 1 wherein said substrate is exposed to said discharge inside the plasma glow region.

5. The method of claim 1 wherein said plasma glow discharge is generated as a radio frequency modulated plasma glow discharge.

6. The method of claim 5 wherein said glow discharge is generated by using radio frequency power between about 1 and about 500 Watts.

7. The method of claim 6 wherein said gas is selected in the group consisting of tetrafluoroethylene, hexafluoropropene, perfluoro-(2-trifluoromethyl-)pentene, perfluoro-(2-methylpent-2-ene) and its trimer, preferably tetrafluoroethylene.

8. The method of claim 7 wherein said substrate is made of a metal or glass or ceramics or semiconductor material and of combinations thereof.

9. The method of claim 7 wherein said substrate is selected in the group consisting of polyethylene, polyacrylics, polypropylene, polyvinyl chloride, polyamides, polystyrene, polyurethanes, polyfluorocarbons, polyesters, silicon rubber, hydrocarbon rubbers, polycarbonates, cellulose and its derivatives, and a film of polyethylene and/or polypropylene.

10. A method according to claim 1 wherein said hydrophobic coating is applied to said substrate at a rate of at least 70 Angstroms per minute.

11. The method of claim 1 wherein said substrate is made of granules or particles.

12. The method of claim 1 wherein said substrate is made of a porous material, selected from the group consisting of an apertured film, fibrous woven or non woven material, and a porous particle or granule material.

13. The method of claim 1 further comprising the step of forming said substrate to a desired shape and subsequently exposing the shaped substrate to said glow discharge.

14. The method of claim 13 wherein said shaped substrate is a hollow container and the inside of said container is exposed to said glow discharge.

15. The method of claim 1 wherein said substrate is exposed to said discharge at its afterglow region.

16. A method for treating a substrate, said method comprising steps of:

providing a substrate;

exposing said substrate to a plasma discharge in the presence of a monomeric gas;

maintaining said gas at a pressure between about 50 mTorr and about 1,000 mTorr;

generating said plasma as a modulated glow discharge, said plasma having a pulsing on time and a pulsing off time; and applying a hydrophobic coating to said substrate, said hydrophobic coating having a thickness of 0.01–2 microns.

17. A method according to claim 16 wherein said hydrophobic coating is applied to yield a water contact angle of at least 165 degrees.

* * * * *